United States Patent
Husain et al.

(10) Patent No.: US 9,118,322 B2
(45) Date of Patent: Aug. 25, 2015

(54) LOW LEAKAGE DYNAMIC BI-DIRECTIONAL BODY-SNATCHING (LLDBBS) SCHEME FOR HIGH SPEED ANALOG SWITCHES

(75) Inventors: Mohammad Suhaib Husain, New Delhi (IN); Shekar Mallikarjunaswamy, San Jose, CA (US)

(73) Assignee: Alpha and Omega Semiconductor (Cayman) LTD, Grand Cayman (KY)

( * ) Notice: Subject to any disclaimer, the term of this patent is extended or adjusted under 35 U.S.C. 154(b) by 214 days.

(21) Appl. No.: 13/034,518

(22) Filed: Feb. 24, 2011

(65) Prior Publication Data
US 2012/0086499 A1    Apr. 12, 2012

(30) Foreign Application Priority Data
Oct. 12, 2010   (IN) .............. 2425/DEL/2010

(51) Int. Cl.
*H03K 17/16*    (2006.01)
*H03K 17/14*    (2006.01)

(52) U.S. Cl.
CPC ...... *H03K 17/145* (2013.01); *H03K 2217/0036* (2013.01); *H03K 2217/0054* (2013.01)

(58) Field of Classification Search
CPC .............. H03K 17/145; H03K 2217/0036; H03K 2217/0054
USPC ................... 327/427, 365, 376, 377
See application file for complete search history.

(56) References Cited

U.S. PATENT DOCUMENTS

| | | | |
|---|---|---|---|
| 5,781,045 A * | 7/1998 | Walia et al. | 327/108 |
| 6,020,778 A * | 2/2000 | Shigehara et al. | 327/534 |
| 6,169,443 B1 * | 1/2001 | Shigehara et al. | 327/534 |
| 6,462,611 B2 * | 10/2002 | Shigehara et al. | 327/534 |
| 6,590,440 B1 | 7/2003 | Williams et al. | |
| 7,724,069 B1 * | 5/2010 | Webb | 327/534 |
| 7,728,649 B1 * | 6/2010 | Webb et al. | 327/534 |
| 7,834,677 B2 * | 11/2010 | Yu | 327/391 |

* cited by examiner

*Primary Examiner* — Hai L Nguyen
(74) *Attorney, Agent, or Firm* — Joshua D. Isenberg; JDI Patent

(57) ABSTRACT

A bidirectional switch device includes a main pass field effect transistor (FET) connected to an input node and an output node. A body region of the first main pass transistor is tied to a voltage substantially halfway between the voltage at the input node side of the first main pass transistor and the voltage at the output node side of the transistor when the first main pass transistor is in an ON state.

18 Claims, 8 Drawing Sheets

LOW LEAKAGE DYNAMIC BI-DIRECTIONAL BODY-SNATCHING (LLDBBS) SCHEME FOR HIGH SPEED ANALOG SWITCHES

CLAIM OF FOREIGN PRIORITY

This application claims priority under 35 USC §119 to application 2425/DEL/2010, filed in India on Oct. 12, 2010, the entire contents of which are incorporated herein by reference.

FIELD OF THE INVENTION

Embodiments of the present invention are directed to high speed bi-directional analog switching and more specifically to bi-directional body snatching switches.

BACKGROUND OF THE INVENTION

An analog switch is used to alternately pass or block a voltage signal which is allowed to vary with time. The switching element can be a transistor, e.g., a field effect transistor (FET) such as a metal-oxide-semiconductor field-effect transistor (MOSFET). The control input to the switch is typically a standard complementary metal-oxide-semiconductor (CMOS) or transistor-transistor logic (TTL) input, which is shifted by internal circuitry to a suitable voltage for changing the state of the switch from a non-conducting state to a conducting state or vice versa. For a typical switch, a logical voltage of 0 on the control input causes the switch to have a high resistance, so that the switch is OFF (non-conducting), and a logic 1 on the input causes the switch to have a low resistance, so that the switch is ON (conducting).

One type of bidirectional analog switch requires two discrete power switches (e.g., MOSFETs) to be placed back-to-back in series, with either a common source or a common drain. The total on-resistance of the switch is then twice that of an individual power MOSFET. An example of such an arrangement is shown in FIG. 1, wherein MOSFETs 10 and 11 are connected in a common source configuration. The conventional bidirectional analog switch has high drain to source resistor ($R_{ds}$) and high capacitance in the on state ($C_{on}$). As seen in FIG. 1, the signal can come from either side. When there is no signal the current can be blocked with back to back body diodes with the switches off. However, this results in high resistance because two switches are in series and have high capacitance.

Typically, a CMOS switch uses a PMOS (p-channel MOS) and an NMOS (n-channel MOS) in parallel across a Switch input (SWIN) and Switch output (SWOUT). In typical MOSFETs, the body is shorted to the source. Since the switch is bi-directional, the polarity of the input and output can flip, and thus the source and the drain of each MOSFET can likewise flip, or have reversed voltages (the use of PMOS and NMOS in parallel ensures that at least one of the MOSFETs will be on since the effective gate voltage is taken with respect to the source). A typical analog switch has CMOS body diodes connected to their sources when the switch is on.

In some prior art bidirectional switches, a body snatching scheme is employed in which the body region of a MOSFET is connected (snatched) to whichever side is currently the source, either SWIN or SWOUT.

U.S. Pat. No. 6,590,440 discloses a bidirectional battery disconnect switch including a four-terminal n-channel MOSFET having no source/body short and circuitry for assuring that the body is shorted to whichever of the source/drain terminals (T3 or T4) of the MOSFET is biased at a lower voltage. As shown in FIG. 2A, a battery disconnect switch S6 includes switch n-channel MOSFET M1 and body bias generator 50. A terminal T3 is connected to the negative terminal of a battery and a terminal T4 is connected to a load or battery charger, as shown in FIG. 2B. Body bias generator 50 includes a first pair of MOSFETs M2 and M3 and a second pair of MOSFETs M4 and M5. MOSFET M2 is connected between the drain and body of MOSFET M1, and MOSFET M3 is connected between the source and body of MOSFET M1, with the source terminals of MOSFETs M2 and M3 being connected to the body of MOSFET M1. MOSFETs M2 and M3 contain a conventional source-body short. The gate of MOSFET M2 is connected to the source of MOSFET M1, and the gate of MOSFET M3 is connected to the drain of MOSFET M1. MOSFETs M4 and M5 are connected in parallel with MOSFETs M2 and M3, respectively. The gate terminals of MOSFETs M4 and M5, however, are connected in common to the body of MOSFET M1. The source and body terminals of MOSFETs M4 and M5 are shorted in the conventional manner, and shorted to the body of MOSFET M1. MOSFETs M2 and M3 function to short the body of MOSFET M1 to whichever of the source and drain terminals of MOSFET M1 is at a lower voltage. MOSFETs M4 and M5 function to prevent the body of MOSFET M1 from "floating" upward to an excessive degree when MOSFETs M2 and M3 are both turned off. MOSFET M2 functions to short the drain and body of MOSFET M1 when the voltage at the drain is lower than the voltage at the source of MOSFET M1, and MOSFET M3 functions to short the body and source of MOSFET M1 when the voltage at the source is lower than the voltage at the drain of MOSFET M1. Thus, the body of MOSFET M1 is clamped to whichever of the drain and source terminals of MOSFET M1 is biased most negatively such that the source and the drain of the MOSFET M1 flip accordingly. In this case, the body snatches to NMOS source dynamically.

In FIG. 2B, a cascode N-channel MOSFET M6 is connected into the circuit. MOSFET M6 is a four-terminal device with no source/body short. The source/drain terminals of MOSFET M6 are connected to the source of MOSFET M1 and gate of MOSFET M2, respectively; the body of MOSFET M6 is connected to the body of MOSFET M1; and the gate of MOSFET M6 is connected to the positive terminal of battery B, a fact which makes it advantageous to implement body bias generator 50 inside the control IC. In this case, the body voltage is clamped below the voltage drop of one diode.

However, the applications for these switches often require fast signal frequency, which means that the capacitance should be low. To do this, the switching devices need to be made small. However, smaller devices tend to have higher drain to source resistance in the ON state $R_{dson}$. The high $R_{dson}$ means that a relatively high drain to source voltage results across the MOSFET when the MOSFET is ON. The relatively high voltage across the MOSFET can turn on an internal body diode (if it goes over typical diode forward voltage drop ~0.7 V). This is highly undesired because it results in loss of control of the MOSFET, and can cause latch up. In addition, the switch shown in FIGS. 2A-2B has slower switching speeds because of the capacitance inherent to body snatching MOSFETs. Furthermore, if the MOSFET M1 on-resistance $R_{dson}$ is too low, then there is insufficient gate bias voltage to snatch the body. It is within this context that embodiments of the present invention arise.

BRIEF DESCRIPTION OF THE DRAWINGS

The teachings of the present invention can be readily understood by considering the following detailed description in conjunction with the accompanying drawings, in which:

FIG. 4A-1 is a schematic diagram of the body-snatching circuit for high speed of FIG. 4A with additional labels.

FIG. 7 is a circuit schematic illustrating a switch circuit in which the body region of a single main FET M1 is tied to a voltage substantially half way between the voltage at the input side of M1 and the voltage at the output side of M1 when M1 is ON.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Dynamic body snatching is applied in a conventional high speed bi-directional analog switch to achieve low $R_{ds}$, low quiescent currents and low power off leakage current. High speed bi-directional analog switches are used in applications for multiplex (Mux), demultiplex (De-Mux) or Universal Serial Bus (USB) (e.g., port sharing, isolation and signal Mux). A high speed bi-directional analog switch has body diodes connected to their sources when it is "ON". As mentioned above, a high speed bi-directional analog switch, for example, an USB 2.0 (480 Mbps), requires low capacitance $C_{on}$ in the ON state, which results in high $R_{ds}$ which in turn can cause the body diodes to conduct.

Figure 3:
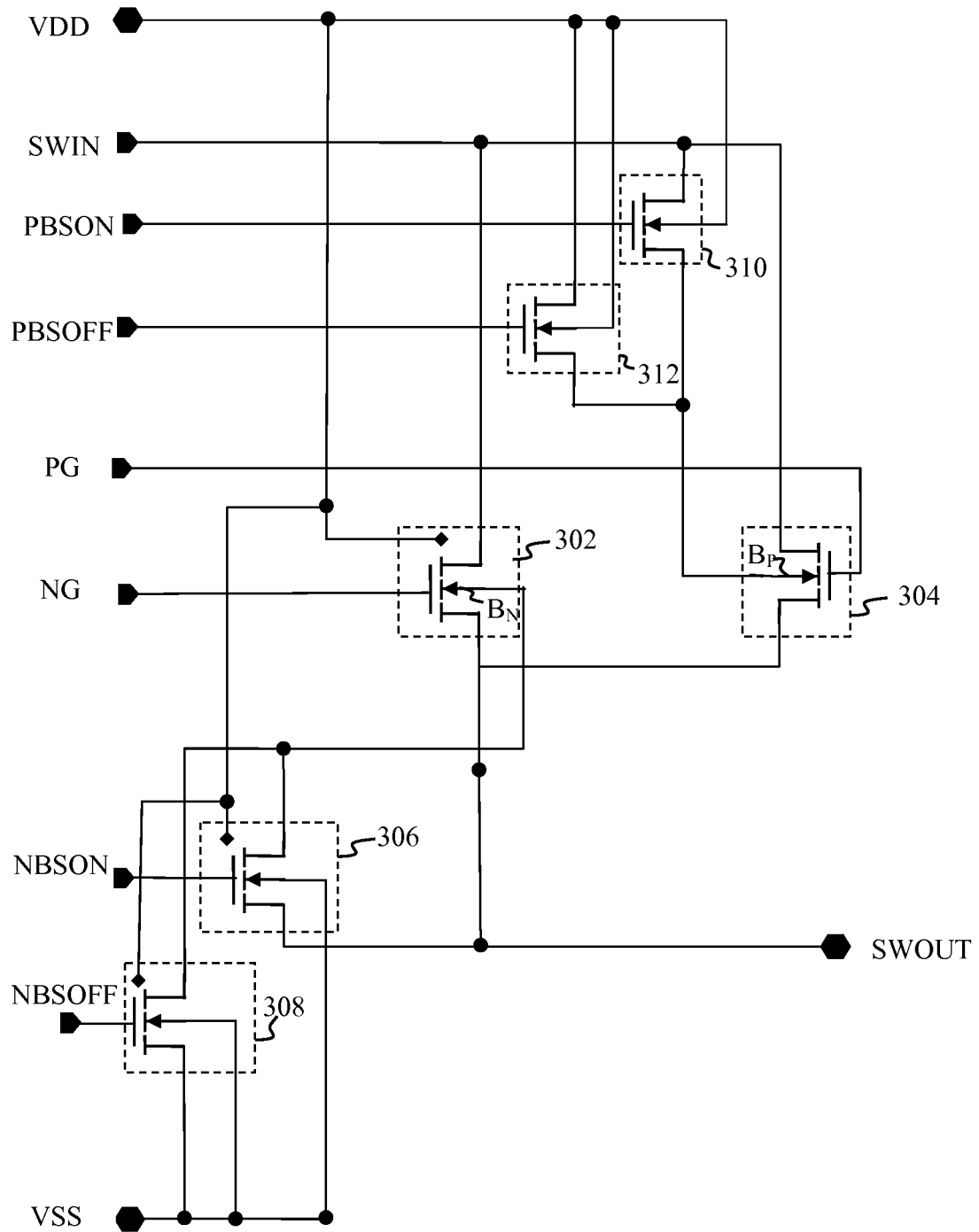
FIG. 3 is a schematic diagram illustrating a low resistance analog switch.

FIG. 3 is a schematic diagram illustrating a low resistance analog switch 300. The switch includes three N-channel FETs 302, 306, 308 and three P-channel FETs 304, 310, and 312. As shown in this figure, in the ON state the body $B_N$ for an N-channel FET 302 is shorted to the output voltage SWOUT through transistor 306 and in the OFF the body $B_N$ is shorted to ground ($V_{SS}$) through transistor 308. In the ON state the body $B_P$ of P-channel FET 304 is shorted to the input voltage SWIN through transistor 310 and in the OFF the body $B_P$ is shorted to the supply voltage ($V_{DD}$) (e.g., to terminal VDD) through transistor 312. The body snatches to the output voltage SWOUT for the NMOS device and to input voltage SWIN for the PMOS device when "ON"; and the body snatches to ground ($V_{SS}$) for the NMOS device and to $V_{DD}$ for the PMOS device when "OFF". The body does not snatch while "ON", it is tied to one side or the other. Having a PMOS in parallel with an NMOS ensures that one of the MOSFETs will be on, despite the fluctuations in the SWIN and SWOUT voltage. However, these MOSFETs still face the problem of the body diode turning on if the voltage drop across the MOSFET becomes greater than the diode forward voltage drop.

To overcome the above-described problems, in embodiments of the present invention, the body region of each main pass transistor in a bi-directional switch circuit is tied to a voltage halfway between the drain and source voltage (rather than at the source voltage). This way, the on voltage drop across each main pass MOSFET can be as almost as high as two diode forward voltage drops (~1.2 to 1.4 V) without turning on the body diode. Also, the channel resistance will be reduced due to the body effect.

When the switch is in the OFF mode, the body regions are connected to a high/supply (VDD) or low/ground ($V_{SS}$) voltage, (depending on whether it's PMOS or NMOS) which helps reduce leakage current.

Figure 1:
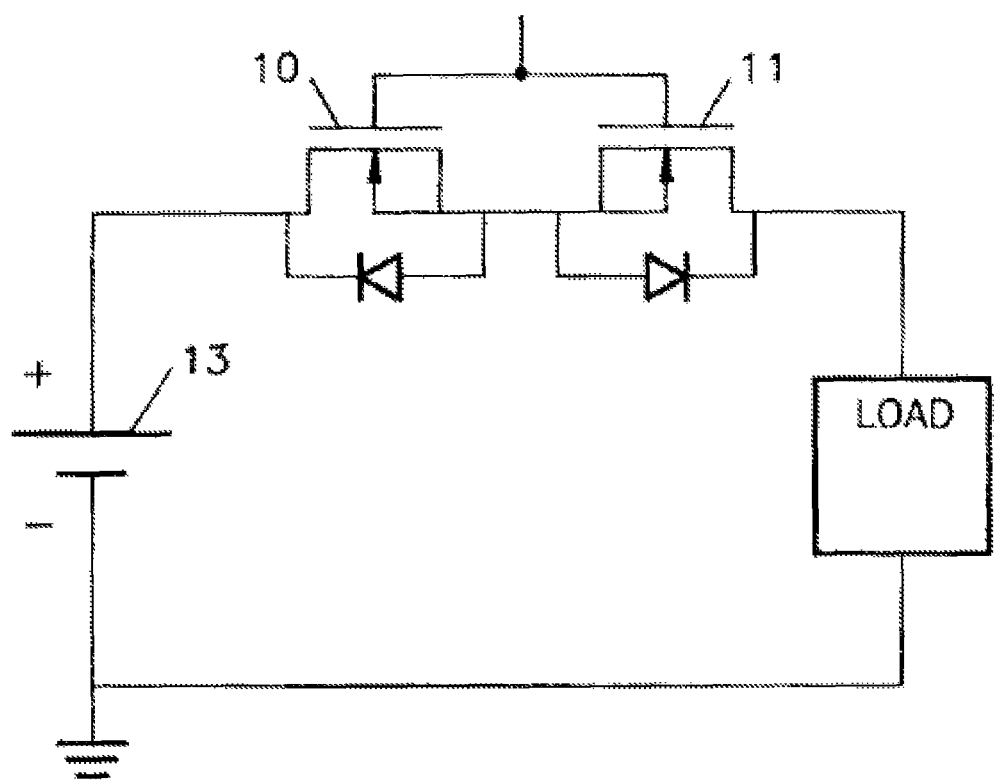
FIG. 1 is a conventional analog switch which includes a pair of MOSFETs connected back-to-back.
Figure 2A:
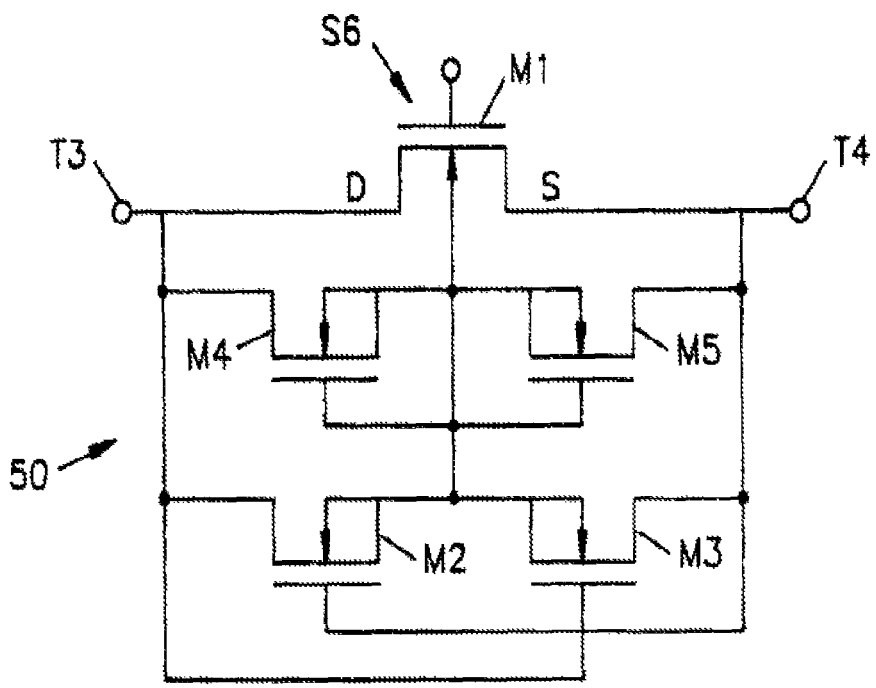
FIGS. 2A-2B are schematic diagrams of battery disconnect switches of the prior art.
Figure 2B:
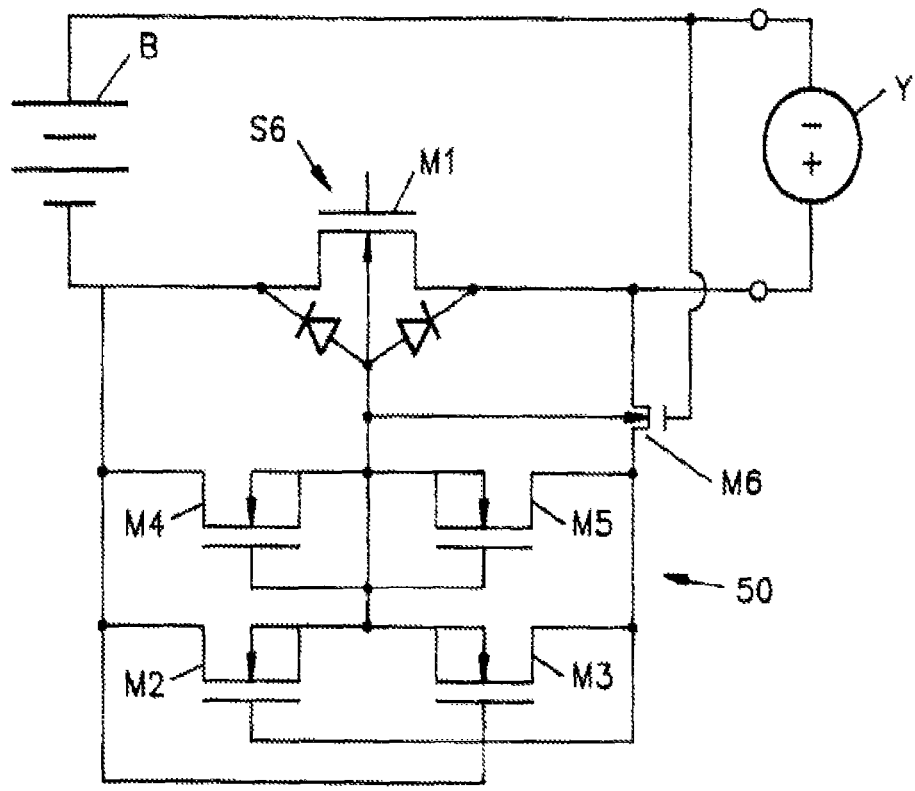
Figure 4A:
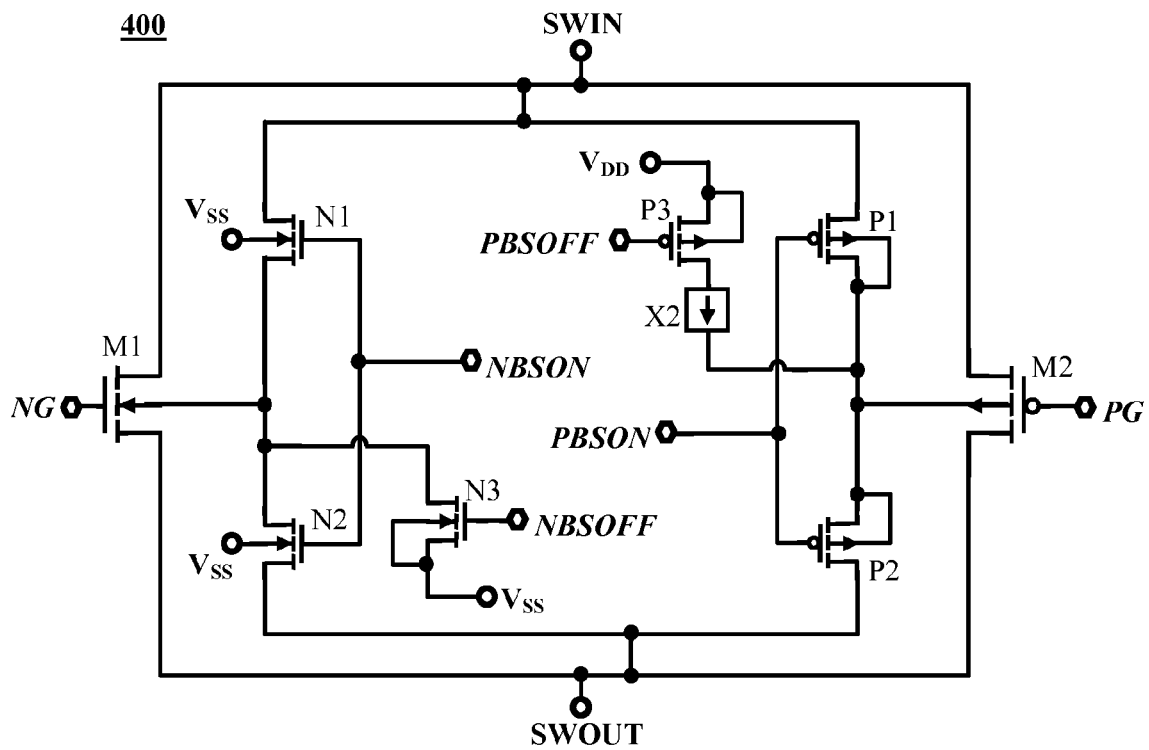
FIG. 4A is a schematic diagram of a body-snatching circuit for high speed analog switches according to an embodiment of the present invention.
Figures 1, 4A:
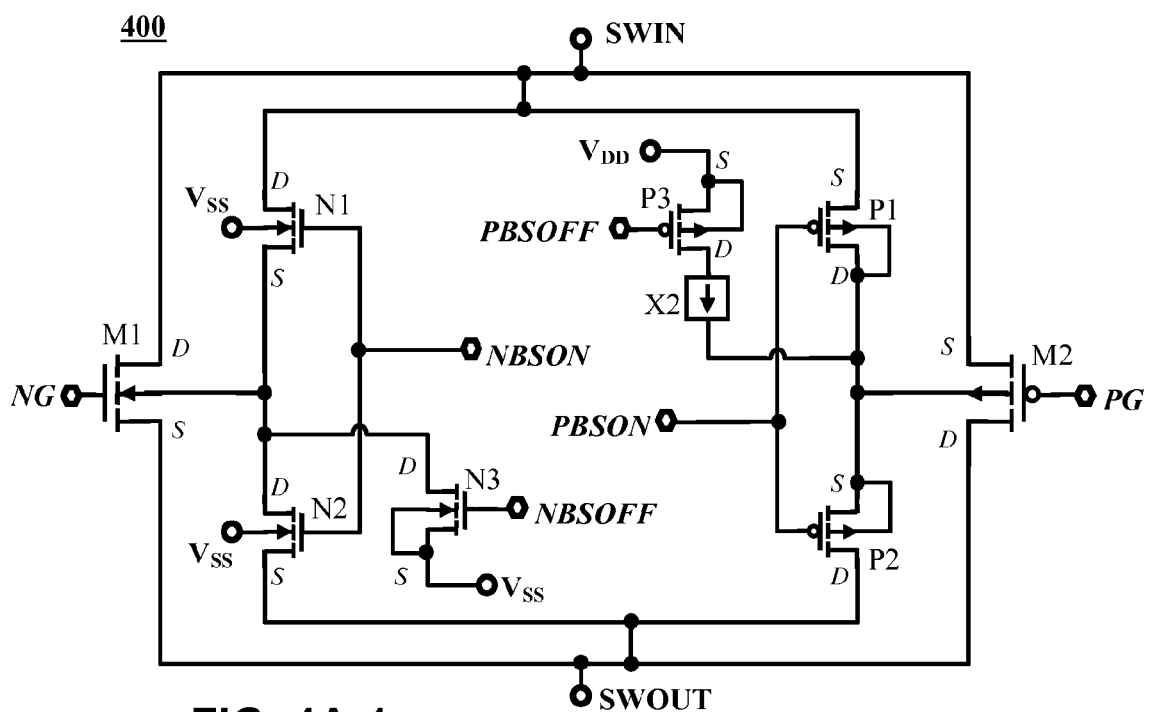

FIG. 4A is a schematic diagram of a body-snatching circuit 400 for implementing a high speed bi-directional analog switch according to an embodiment of the present invention. In the circuit 400, an NMOS FET M1 and a PMOS FET M2 act as main pass FETs for a CMOS switch. The main FETs M1 and M2 are connected between a switch input terminal SWIN and a switch output SWOUT terminal with the drain of the NMOS M1 and the source of the PMOS M2 connected to the switch input terminal SWIN and the sources connected to the switch output terminal SWOUT, or vice-versa. Since the switch is bi-directional, the switch output SWOUT and switch input SWIN may flip voltage bias, and likewise the source and the drain (i.e., input and output) of the main FETs M1 and M2 may also flip sides. However, in this application, the labels 'source' and 'drain' of FETs are typically used with respect to the condition in which SWIN is positively biased to SWOUT, for convenience in referring to circuit parts. For convenience, this labeling convention is shown in FIG. 4A-1 with 'D' referring to drain, and 'S' referring to source. M1 and M2 are symmetrical devices so their sources and drains are interchangeable based on whether the signal is coming from an input or an output. In general for all signals the drain on the NMOS device M1 is connected to source of the PMOS M2 or vice-versa (never drain to drain or source to source).

N-channel ON FETs N1, N2 are coupled in series between the switch input terminal SWIN and the switch output terminal SWOUT. When the signal comes from SWIN, the drain of FET N1 is coupled to the switch input SWIN and the source of FET N1 is coupled to the drain of FET N2. The source of FET N2 is coupled to the switch output SWOUT terminal. The body of main NFET M1 is coupled between the source of FET N1 and the drain of FET N2. The N-channel ON FETs N1, N2 have equal on resistance $R_{dson}$. The bodies of N-channel ON FETs N1, N2 can be shorted to ground ($V_{SS}$). It is noted that in general the drain/source designations for FETs N1, N2 depend on the potential across the NMOS main FET M1. For example if the input SWIN in more positive than the output SWOUT meaning the signal in coming in from the input SWIN then the drain of N1 is connected to SWIN and the source for N2 is connected to SWOUT (and if the output terminal SWOUT becomes more positive than the input terminal SWIN, then the side of N1 connected to SWIN becomes the source, and the side of N2 connected to SWOUT becomes the drain). The source and drain designations can be interchanged when the signal comes in from SWOUT.

In a like manner, P-channel ON FETs P1, P2 may be coupled in series between the switch input terminal SWIN and the switch output terminal SWOUT. The input (e.g., source) of FET P1 is coupled to the switch input SWIN and the output (e.g., drain) of FET P1 is coupled to the input (e.g., source) of FET P2. The output (e.g., drain) of FET P2 is coupled to the switch output SWOUT terminal. As opposed to N1, if the signal comes from the input terminal SWIN (i.e., the voltage at SWIN is more positive than at SWOUT) then the source of P1 is connected to SWIN and its drain and body are connected to source and body of P2 and the drain of P2 is connected to SWOUT. These designations are reversed if the signal comes from the output terminal SWOUT. The body of main P-channel FET M2 is coupled between the drain of FET P1 and the source of FET P2. The P-channel ON FETs P1, P2 have substantially equal on-resistance $R_{dson}$. In this example, the bodies of the FETs P1, P2 are both shorted to the same voltage as the body of the main pass P-channel FET M2.

An N-channel OFF control FET N3 may be coupled between ground voltage $V_{SS}$ and the body of the main NFET M1. The source of FET N3 is coupled to $V_{SS}$ and the drain of FET N3 is coupled to the body of the main FET M1. The body of N-channel OFF FET N3 can be shorted to ground ($V_{SS}$). In this case the highest potential is the drain of FET N3 which is coupled to the body of main FET M1 since the source/body of FET N3 is connected to $V_{SS}$. In a like manner, a P-channel OFF control FET P3 and a current blocking device X2 can be coupled in series between the supply voltage $V_{DD}$ and the body of the main P-channel FET M2. The blocking device X2 blocks a leakage current path in the OFF state. The leakage current path is from the input SWIN or the output SWOUT through the source or drain of main FET M2 to the main FET M2 body diode (BD3 or BD4 in FIG. 4D) through the drain of FET P3 into its source/body to $V_{DD}$ when it is at 0V. In other words, the blocking device X2 ensures that there is no leakage current from SWIN to SWOUT when $V_{DD}$ is at 0V, or when SWIN or SWOUT are more positive than $V_{DD}$.

The source and body of the FET P3 can be coupled to the supply voltage $V_{DD}$ and the blocking device X2 can be coupled between the drain of the FET P3 and the body of the main P-channel FET M2, with the cathode side of blocking device X2 connected to the body of main FET M2. The construction of P-channel ON FETs P1, P2 form the equivalent to back-to-back body diodes for current blocking between SWIN and SWOUT when M2 is in the OFF state.

Figure 4B:
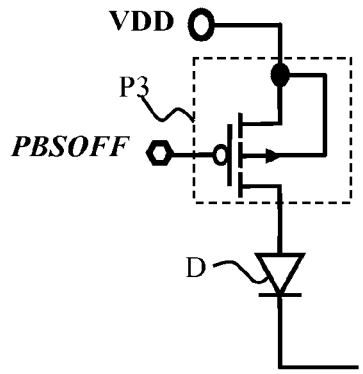
FIG. 4B is a schematic diagram illustrating the use of a diode as a current blocking device in the circuit of FIG. 4A.
Figure 4C:
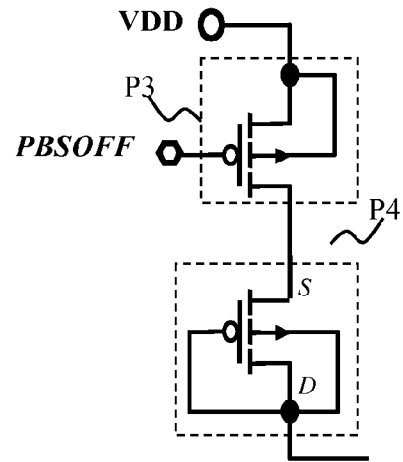
FIG. 4C is a schematic diagram illustrating the use of a P-channel FET as a current blocking device in the circuit of FIG. 4A.

In operation, a gate of the main N-channel FET M1 is connected to an N-channel gate control signal NG and a gate of the main P-channel FET M2 is connected to a P-channel gate control signal PG. As shown in the timing diagram of FIG. 4E, the gate control signals NG and PG are synchronized with each other (though with opposite polarity) so that M1 and M2 turn on and turn off at the same time. Please note that when the gate signals to n-channel FETs are high, the n-channel FET turns on, and when the gate signals to p-channel FETs are low, the p-channel FET turns on, and vice-versa. The main pass FETs M1 and M2 turn on when it is desired to turn the bi-directional switch ON, and they turn off when it is desired for the bi-directional switch to be OFF. An N-body ON signal (NBSON) is coupled to the gates of N-channel ON FETs N1, N2. In a like manner, a P-body ON signal (PBSON) is coupled to the gates of P-channel ON FETS P1, P2. The N-body ON signal NBSON and P-body ON signal PBSON are synchronized to the gate control signals NG, PG so that the ON FETs N1, N2, P1, P2 are all turned on when main FETs M1 and M2 are turned on, and vice-versa.

An N-body OFF signal (NBSOFF) is coupled to the gate of N-channel OFF control FET N3 and a P-body OFF signal (PBSOFF) is coupled to the gate of P-channel OFF control FET P3. The N-body OFF signal NBSOFF and P-body OFF signal PBSOFF are synchronized to the gate control signals NG, PG so that the OFF FETs N3, P3 are both turned on when main FETs M1 and M2 are turned off, and vice-versa. Control signals NBSON and NBSOFF work out of phase with respect to each other with a dead-time in between. Control signals PBSON and PBSOFF also work out of phase with respect to each other with a dead-time in between. The NBSOFF and NBSON signals have a "break before make" relationship, i.e., the FETs controlled by NBSOFF must turn off before the FETs controlled by NBSON turn on, and vice-versa. This is to ensure that FETs N1 and N2 will not be ON at the same time as FET N3, so that current from SWIN or SWOUT will not be shorted through NBSOFF to the ground voltage $V_{SS}$. Thus, as shown in the timing diagram of FIG. 4E, a small delay time, $t_d$, exists between NBSOFF turning off and NBSON turning on, and also between NBSON turning off and NBSOFF turning on. PBSOFF and PBSON signals similarly have a "break before make" relationship to avoid shorts from SWIN or SWOUT to supply voltage $V_{DD}$.

Figure 4D:
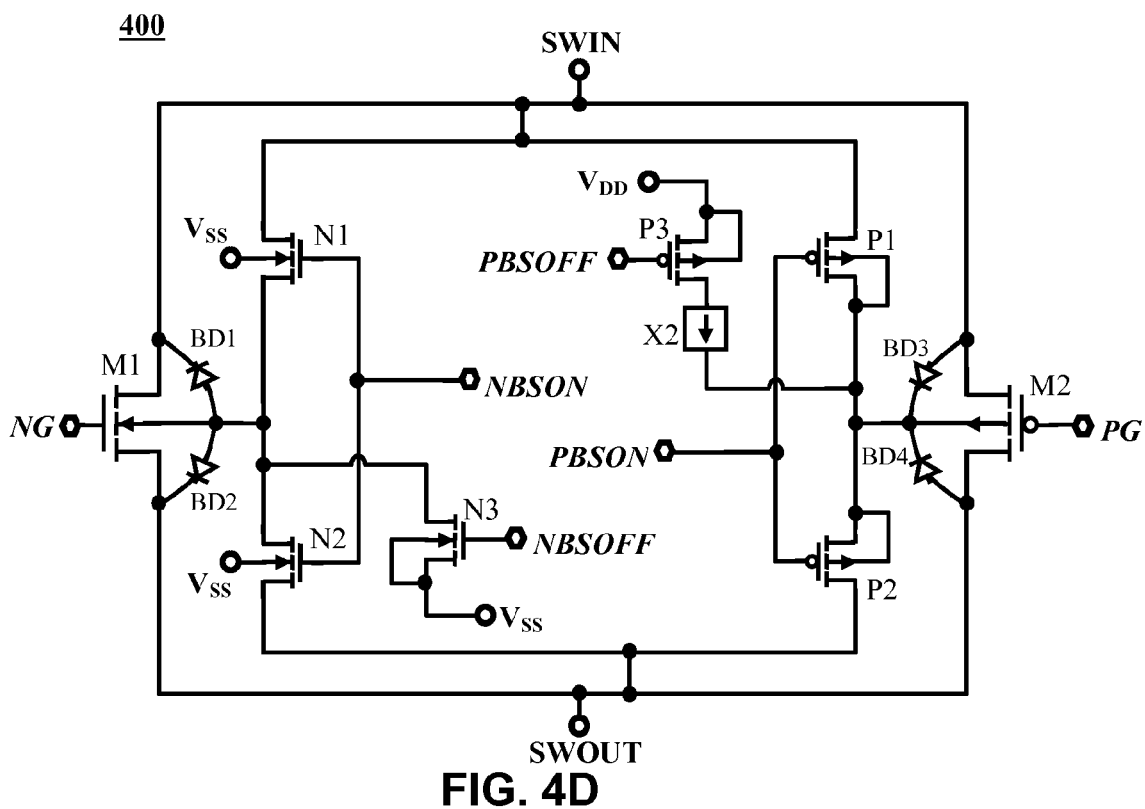
FIG. 4D is the schematic diagram of the body-snatching circuit of FIG. 4A with body diodes of the main pass transistors shown.
Figure 4E:
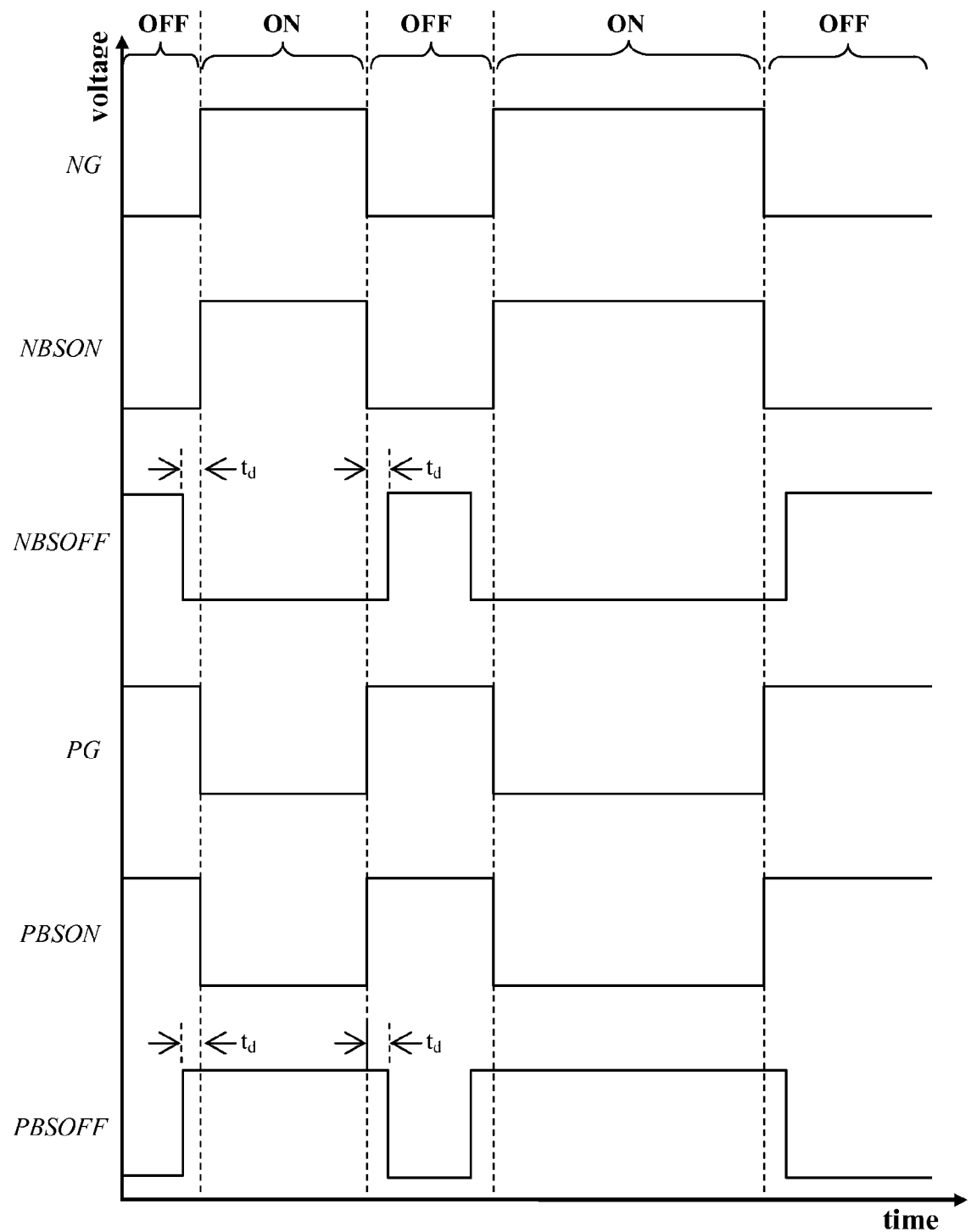
FIG. 4E is a timing diagram illustrating operation of the circuit of FIG. 4A.

In the configuration described above, when the switch is in the ON state (i.e., when main FETS M1 and M2 are on), the FETs controlled by the signals NBSON (i.e., N1, N2) and PBSON (i.e., P1, P2) connect the body regions of the main FETs M1 and M2 to intermediate voltages substantially halfway between the source and drain voltages of M1 and M2 respectively. As shown in the timing diagram of FIG. 4E, when the main FETs M1 and M2 are off, the OFF control signals NBSOFF, PBSOFF that drive the gates of OFF control FETs N3, P3 are synchronized to turn on the FETs N3, P3 to connect the body regions of main N-channel FET M1 to ground voltage $V_{SS}$ (low voltage) and the body of main P-channel FET M2 towards supply voltage $V_{DD}$ (high voltage), respectively, to minimize leakage through main FETs M1 and M2 (this reverse biases the body diodes, as can be seen in FIG. 4D). By way of example the FETs N1, N2, P1, and P2 can be designed to be much smaller and have much higher on resistance than the main FETs M1 and M2, such that most of the current flows through the main FETs M1 and M2 when the switch is on.

In an OFF state for the circuit 400, the main pass FETs (M1 and M2) are OFF, and the FETs driven by PBSOFF and NBSOFF turn ON. This connects the body of M1 to $V_{SS}$ and the body of M2 to an intermediate voltage given by $V_{DD}-V_{X2}$, where $V_{X2}$ is the voltage drop across the blocking device X2. A leakage current out through $V_{DD}$ is reduced because the blocking device X2 blocks current flow towards the supply voltage $V_{DD}$. By way of example, the blocking device X2 can be a diode D as shown in FIG. 4B or a P-channel blocking FET P4 with its gate and its body shorted to its drain as shown in FIG. 4C. In the configuration shown in FIG. 4C, the FET P4 acts like a pseudo-Schottky diode, allowing conduction in one direction, but blocking conduction in the other direction. Under steady-state (and while the switch is OFF), the body of M2 eventually gets pulled up to supply voltage $V_{DD}$ through the forward biased pseudo-Schottky action of the P-channel FET P4. The gate of the blocking FET P4 should not be connected to PBSOFF because this would allow a high current $I_{OFF}$ during a power off condition.

In an ON state for the circuit 400, the main pass FETs M1 and M2 are ON, the P-body ON signal PBSON turns P-channel FETS P1, P2 ON and the N-body ON signal NBSON turns N-channel FETS N1, N2 ON. The FETs N1 and N2, having equal on-resistance, connect the body of main N-channel FET M1 to a voltage which is approximately half-way between its drain and source voltage. Similarly, in the ON state, the body of main P-channel FET M2 is connected to a voltage that is approximately halfway between the source and drain voltages of the main P-channel FET M2 because of the FETs P1 and P2, which have equal on-resistance. Assuming that the total voltage drop across the main FETs M1, M2 never goes higher than two body diode drops, the body diodes of M1 and M2 will not turn ON.

FIG. 4D shows the same circuit diagram 400 of FIG. 4A, except that FIG. 4D also explicitly illustrates the body diodes BD1, BD2, BD3 and BD4 of the main pass FETs M1 and M2. Body diode BD1 is formed between the input side (drain in FIG. 4A-1) of main FET M1, and the body region of M1, and body diode BD2 is formed between the output side (source in FIG. 4A-1) of main FET M1, and the body region of M1. Since the source and drain regions (input/output) are n-type and the body regions are p-type for n-channel FETs, the anodes of body diodes BD1 and BD2 are at the body region side, and the cathodes are on the input and output side. Similarly, body diode BD3 is formed between the input side (source in FIG. 4A-1) of main FET M2 and the body region of M2. Body diode BD4 is formed between the output side (drain in FIG. 4A-1) of main FET M2 and the body region of M2; however, the polarities of body diodes BD3 and BD4 are reversed with respect to BD1 and BD2. When the switching circuit 400 is in the ON state, FETs M1, N1 and N2 are turned ON. A current can potentially form from the terminal SWIN through FET N1 and across the body diode BD2. For the body diode BD2 to turn on, the voltage at the body region of the main pass FET M1 must be a diode forward voltage drop higher than the voltage at the output side of M1. Since the body region of main pass FET M1 is tied to half way between the input and output sides of main pass FET M1 by FETs N1 and N2, this means the total voltage drop across the input and output sides of main pass FET M1 can be up to two voltage drops (when the switch is in the ON state) before the body diode conducts. The same concept can be applied to the other body diodes BD1, BD3 and BD4. Thus the main pass FETs may be made even smaller, to achieve lower capacitance (with the accompanying higher on resistance $R_{dson}$ and thus higher voltage drops across the main pass FETs) without concern of the main pass FETs body diodes turning on; or the main pass FETs can be left the same size, but with a much greater safety margin against the main pass FETs body diodes turning on.

Furthermore, since the body voltages of main FETs M1 and M2 are forward biased to their source voltages in the ON state (rather than being tied to the source voltages), the threshold voltage $V_t$ for M1 and M2 reduces due to the body effect, and accordingly, the channel resistance of the circuit 400 in the ON state is reduced. Any increase in capacitance of the circuit 400 in the ON state due to body effects is more than compensated by the benefit in reduced ON resistance.

In the OFF state for the circuit 400, the body of main N-channel FET M1 is snatched to ground voltage ($V_{SS}$) and the body for main P-channel FET M2 is snatched to the supply voltage ($V_{DD}$). In the ON state (i.e., NBSOFF is off and NG is on) NBSON is on and the body of M1 is snatched to half the voltage drop across the switch (i.e., half the voltage between input terminal SWIN and output terminal SWOUT. This means that the body diode can only turn on if there is a voltage drop that is twice as large as the normal body diode voltage while M1 is on. This increases the voltage range and allows for a larger voltage drop, which means you can make the switch smaller for higher resistance. In addition, the body is at a determined potential (not a floating potential as in some prior art switches).

In ON and OFF states, things work similarly for the P-channel main FET M2. However, in the OFF state, there is a leakage path to supply voltage $V_{DD}$ through the P-channel OFF control FET P3. To address this, the blocking device X2 is included between the P-channel OFF control FET P3 and the body of P-channel main FET M2.

The construction of the switching circuit 400 allows smaller switch components to be used because of the higher body diode turn-on voltage capabilities of M1 and M2, which can reduce the capacitance of the circuit 400 by half thereby reducing the propagation delay and improving signal speed through the switch. The increased resistance does not affect the propagation delay if the current is small. By way of example, most high speed bi-directional analog switch applications call for currents of less than tens of milliamps (mA). Bi-directional analog switches are usually used for transferring voltage signals, so they typically pass small currents. By way of example, the capacitance can be decreased from 120 pF to 4 pF (a factor of 30) in a limited voltage range (0-0.4 V for USB) while the resistance only increases by about 10×.

Figure 5:
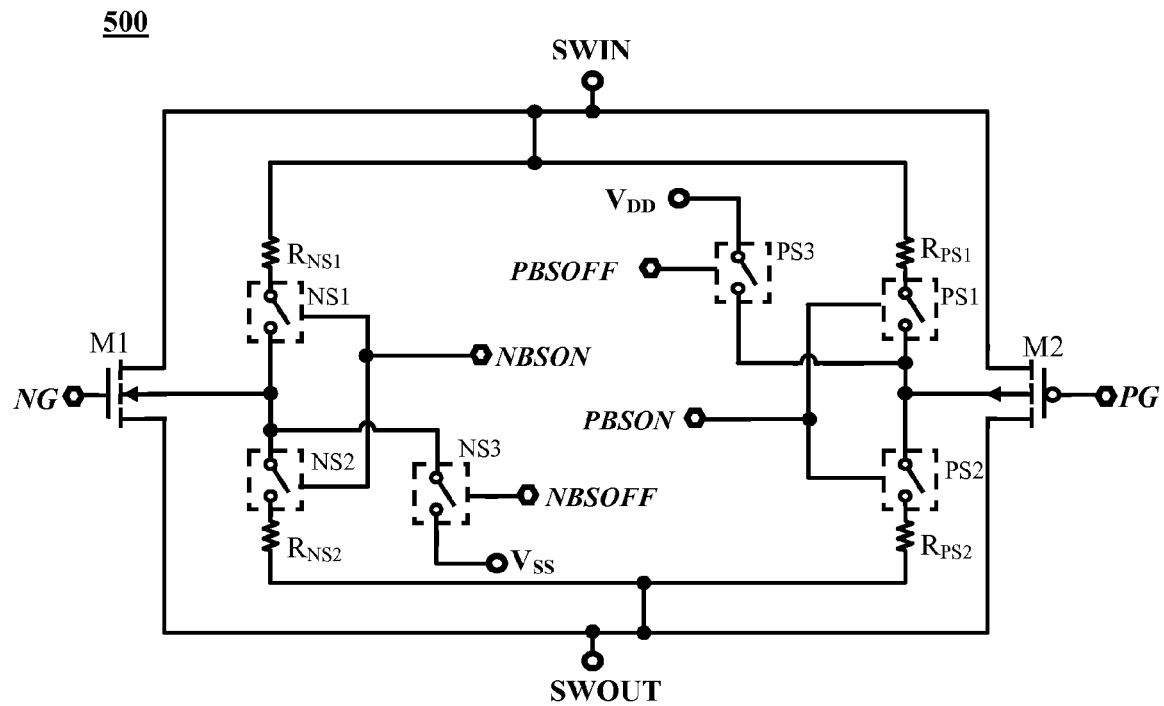
FIG. 5 is a schematic diagram of body-snatching circuit for high speed analog switches according to an alternative embodiment of the present invention.

For the purpose of example, the switch 400 of FIG. 4A-4D is described in terms of N-channel and P-channel MOSFET devices for all of the switching components. However, embodiments of the present invention are not limited to switch circuits based on MOSFET devices. A circuit similar in operation to the switch 400 may be constructed using components other than MOSFETs for most of the switching components. FIG. 5 is a schematic diagram of body-snatching circuit for a high speed bi-directional analog switch 500 according to an alternative embodiment of the present invention. The bi-directional analog switch 500 is a generic version of the circuit 400 of FIG. 4A. In this embodiment, the main pass switching components are still an N-channel FET M1 and a P-channel FET M2. However, the N-channel ON FETs N1, N2 and P-channel ON FETs P1, P2 may be replaced with generic switching devices NS1, NS2, PS1 and PS2, respectively. Similarly, the N-channel OFF MOSFET N3 and the P-channel OFF MOSFET P3 can be replaced with generic switching devices NS3 and PS3, respectively. An optional blocking device X2 (not shown) may be include between switching device PS3 and the body of main pass P-channel FET M2, but may not be necessary, depending on the implementation of the generic switching devices. By way of example, and not by way of limitation, the generic switching devices may be bipolar junction transistors (BJT), field effect transistors, such as insulated gate field effect transistors (IGFETs), insulated gate bipolar transistor (IGBT), junction field effect transistors (JFETs), and the like.

The switching devices NS1 and NS2 generally have associated resistances $R_{NS1}$, $R_{NS2}$. The devices are NS1 and NS2 are selected such that the associated resistances $R_{NS1}$, $R_{NS2}$ are equal or approximately equal. This ensures that the body of the main pass N-channel FET M1 is snatched to a voltage substantially halfway between the drain and source voltages for the main pass N-channel FET M1 when the switch 500 is in the ON state. This can be done by electrically coupling an output of the switch NS1 and an input of switch NS2 to the body of the N-channel FET M2. In a like manner, the switching devices PS1 and PS2 are selected such that their associated resistances $R_{PS1}$, $R_{PS2}$ are equal or approximately equal so that the body of the main pass P-channel FET M2 is snatched to a voltage roughly halfway between the drain and source voltages for the M2 when the switch is in the ON state. This can be done by electrically coupling an output of the switch PS1 and an input of switch PS2 to the body of the P-channel FET M2. Alternatively resistances $R_{NS1}$, $R_{NS2}$, $R_{PS1}$, $R_{PS2}$, can be provided by resistors that are separate from the on resistance of switching devices NS1, NS2, PS1, PS2. The resistors can be selected so that $R_{NS1}=R_{NS2}$, and $R_{PS1}=R_{PS2}$. Resistances $R_{NS1}$, $R_{NS2}$, $R_{PS1}$, $R_{PS2}$ should be relatively large, e.g., large enough so that most of the current is directed through the main pass FETs M1, M2 when the switch in ON.

Figure 6:
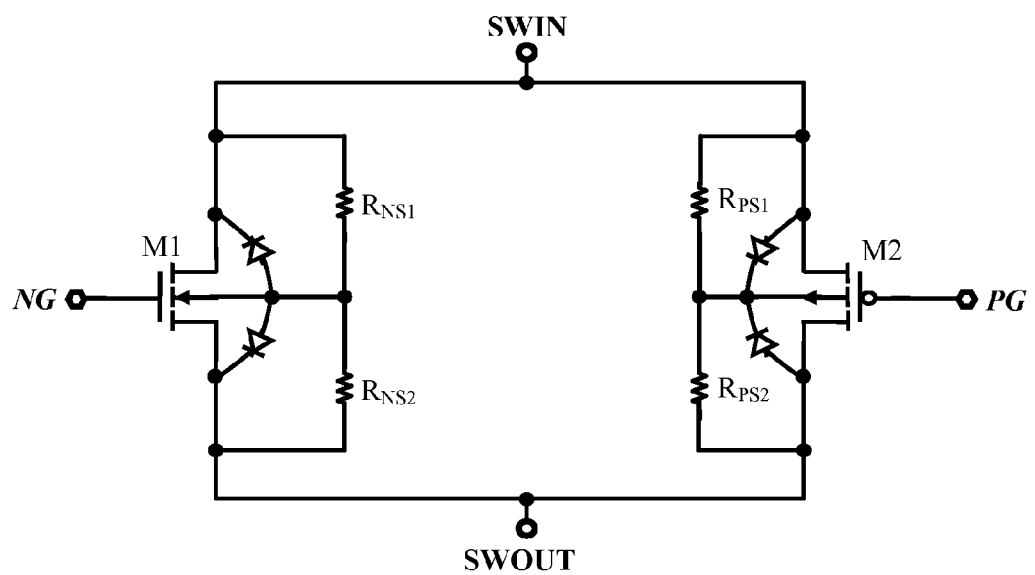
FIG. 6 is a circuit schematic illustrating the simplified ON state operation of a switch circuit according to an embodiment of this invention.

FIG. 6 is a circuit schematic illustrating the simplified ON state operation of a switch circuit according to an embodiment of the present invention. An N-channel main pass FET M1 is connected between an input terminal/node and an output terminal/node. The body region of main pass FET M1 is tied to a voltage substantially halfway between the voltage at the input side of M1 and the voltage at the output side of M1. Similarly, a P-channel main pass FET M2 is connected between the input and output terminals, in parallel with n-channel main pass FET M1. The body region of main pass FET M2 is also tied to a voltage substantially halfway between the voltage at the input side of M2 and the voltage at the output side of M2. This can be achieved by selecting the appropriate resistances $R_{NS1}$, $R_{NS2}$, $R_{PS1}$, $R_{PS2}$ between the body regions of M1 and M2 and the input/output sides of M1 and M2. The resistances should be chosen such that $R_{NS1}=R_{NS2}$, and $R_{PS1}=R_{PS2}$. By way of example but not limitation, resistances $R_{NS1}$, $R_{NS2}$, $R_{PS1}$, $R_{PS2}$ can be implemented as resistors, or as the on resistance of the switching devices, or in any other manner.

Operation of the switch 500 of FIG. 5 is substantially the same as described above with respect to the circuit 400 of FIG. 4A. Specifically, in an ON state, when main gate signals NG, PG turn on main pass FETS M1, M2, N-body and P-body ON signals NBSON, PBSON turn on switching devices NS1, NS2, PS1, PS2. In an OFF state, when main gate signals NG, PG turn on main pass FETS M1, M2, N-body and P-body OFF signals NBSOFF, PBSOFF turn on switching devices NS3, PS3.

Figure 7:
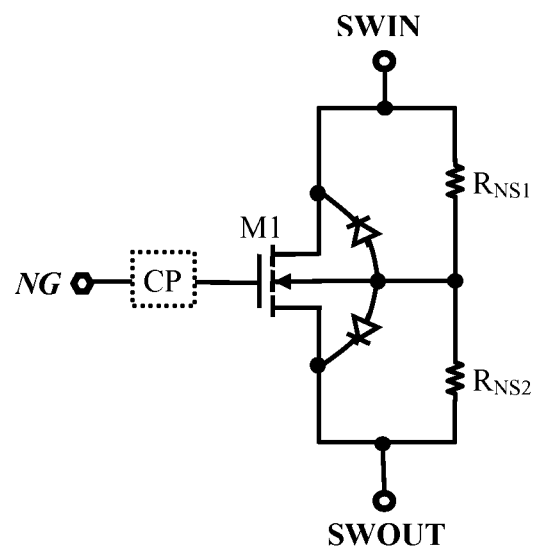

As shown in FIG. 7 the concept described above can be extended to a circuit 600 having a single main FET M1 (shown as an N-channel FET) by tying the body region of the single main FET M1 to a voltage substantially half way between the voltage at the input side of M1 and the voltage at the output side of M1 when M1 is ON. As explained above, this can be accomplished by putting resistances $R_{NS1}$ and $R_{NS2}$ between the body region of the main FET M1 and the input and output sides of M1. The resistances $R_{NS1}$ and $R_{NS2}$ should be substantially the same value. Resistances $R_{NS1}$, $R_{NS2}$ should be relatively large, so that current is directed through the main pass FET M1. Optionally, a charge pump CP may be included with the gate signal NG, to ensure that gate signal stays strong with respect to the source when M1 is desired to be ON, regardless of the voltage fluctuations of input terminal SWIN and output terminal SWOUT. It should be clear that this concept can be extended to a P-channel main FET.

While the above includes a complete description of the preferred embodiment of the present invention, it is possible to use various alternatives, modifications and equivalents. By way of example, although the invention mentions bi-directional analog switches, it can also apply to bi-directional digital switches. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A high speed bidirectional switch device, comprising:
a main pass N-channel transistor connected between an input node and an output node; first and second switching devices connected in series with each other between the input node and the output node, wherein the first and second switching devices have the same resistance in an ON state, wherein a body region of the main pass N-channel transistor is directly electrically coupled between the first switching device and the second switching device at all times, whereby the body region of the main pass N-channel transistor is snatched to a voltage that is half way between the voltage at the input node side and output node side of the main pass N-channel transistor when the first and second switching devices are in the ON state, wherein body regions of the first and second switching devices are shorted to a ground ($V_{SS}$) terminal at all times;
a main pass P-channel transistor connected in parallel with the main pass N-channel transistor between the input node and the output node; and
third and fourth switching devices connected in series with each other between the input node and the output node, wherein the third and fourth switching devices have the same resistance in an ON state, wherein a body region of the main pass P-channel transistor is electrically coupled between the third switching device and the fourth switching device, whereby the body region of the main pass P-channel MOSFET is snatched to a voltage that is half way between the voltage at the input node side and the output node side of the P-channel transistor when the third and fourth switching devices are in the ON state.

2. The device of claim 1, further comprising a fifth switching device connected between the ground ($V_{SS}$) terminal and the body region of the main pass N-channel transistor, a sixth switching device between a supply ($V_{DD}$) terminal and the body region of the main pass P-channel transistor.

3. The device of claim 2 wherein the main pass P-channel transistor, main pass N-channel transistor, first, second, third, and fourth switching devices are ON and the fifth and sixth switching devices are OFF when said high speed bidirectional switch device is in the ON state and wherein the main pass P-channel transistor, main pass N-channel transistor, first, second, third, and fourth switching devices are OFF and the fifth and sixth switching devices are ON when said high speed bidirectional switch device is in the OFF state.

4. The device of claim 2, wherein the first, second, and fifth switching devices and the main pass N-channel transistor are metal oxide semiconductor field effect transistor (MOSFET) devices and the third, fourth and sixth switching devices and the main pass P-channel transistor are MOSFET devices.

5. The device of claim 4 wherein body regions of the third and fourth switching devices are shorted to the body region of the main pass P-channel transistor and wherein a body region of the sixth switching device is shorted to the supply terminal.

6. The device of claim 2 further comprising a current blocking device electrically coupled in series with said sixth switching device between said supply ($V_{DD}$) terminal and said body region of the main pass P-channel transistor wherein the current blocking device is configured to block a leakage current between the body region of the main pass P-channel transistor and the $V_{DD}$ terminal in the OFF state.

7. The device of claim 6 wherein the current blocking device is a diode.

8. The device of claim 6 wherein the current blocking device is a field effect transistor having a body and a gate, wherein the gate and body of the current blocking device are shorted to the body region of the main pass P-channel transistor.

9. A bidirectional switch device, comprising:
a first main pass field effect transistor (FET) connected to an input node and an output node, wherein a body region of the first main pass FET is tied to a voltage substantially halfway between the voltage at the input node side of the first main pass FET and the voltage at the output node side of the first main pass FET when the first main pass FET is in an ON state; and a plurality of switching devices connected in parallel between the input node and the output node, the plurality of switching devices including first and second switching devices connected in series with each other between the input node and the output node, wherein the body region of the first main pass FET is directly electrically coupled between the first switching device and the second switching device and wherein body regions of the first and second switching devices are shorted to a ground ($V_{SS}$) terminal all the time.

10. The device of claim 9 wherein the body region of the first main pass FET is tied to the ground ($V_{SS}$) terminal when the first main pass transistor is in an OFF state.

11. The device of claim 9 further comprising a charge pump connected to a gate of the first main pass FET.

12. The device of claim 9 wherein the first main pass FET is a main pass N-channel FET and wherein the bidirectional switch device further comprises a main pass P-channel FET connected in parallel to the main pass N-channel FET between the input node and the output node,
wherein a body region of the P-channel main pass FET is tied to a voltage substantially halfway between the voltage at the input node side of the P-channel main pass FET and the voltage at the output node side of the P-channel main pass FET when the switch device is in an ON state.

13. The device of claim 12, further comprising:
a resistance $R_{NS1}$ between the input node and the body region of main pass N-channel FET;
a resistance $R_{NS2}$ between the output node and the body region of main pass N-channel FET;
a resistance $R_{PS1}$ between the input node and the body region of main pass P-channel FET; and
a resistance $R_{PS2}$ between the output node and the body region of main pass P-channel FET,
wherein the resistance $R_{NS1}$ is substantially equal in value to the resistance $R_{NS2}$ and resistance $R_{PS1}$ is substantially equal in value to the resistance $R_{PS2}$ when the main pass FETs are in an ON state.

14. The device of claim 12, wherein the plurality of switching devices is configured such that the body region of each main pass transistor is tied to a voltage substantially halfway between the drain and source voltage of the main pass FETs when the main pass FETs are in an ON state and wherein the body region of the main pass N-channel transistor is tied to a ground voltage ($V_{SS}$) when the main pass FETs are in an OFF state and wherein the body region of the main pass P-channel is tied to a supply voltage ($V_{DD}$) when the main pass transistors are in the OFF state.

15. The device of claim 14, wherein the plurality of switching devices is configured such that a voltage across each main pass transistor in the ON state may be up to two diode forward voltage drops before turning on a body diode of the main pass transistor.

16. The device of claim 14 wherein the first and second switching devices have substantially the same resistance in an ON state, wherein the body region of the main pass N-channel transistor is electrically coupled between the first switching device and the second switching device, whereby the body region of the main pass N-channel transistor is snatched to a voltage that is half of the voltage between the input and output terminals when the first and second switching devices are in the ON state.

17. The device of claim 16, further comprising a third switching device connected between a ground ($V_{SS}$) terminal and the body region of the main pass N-channel transistor.

18. The device of claim 16 wherein the plurality of switching devices includes third and fourth switching devices connected in series with each other between the input terminal and the output terminal, wherein the third and fourth switching devices have the substantially the same resistance in an ON state, wherein a body region of the main pass P-channel MOSFET is electrically coupled between the third switching device and the fourth switching device, whereby the body region of the main pass P-channel MOSFET is snatched to a voltage that is half of the voltage between the input and output terminals when the third and fourth switching devices are in the ON state.

* * * * *